US011494261B2

(12) United States Patent
Achtenberg et al.

(10) Patent No.: US 11,494,261 B2
(45) Date of Patent: Nov. 8, 2022

(54) MACHINE LEARNING FOR TEMPERATURE COMPENSATION

(71) Applicant: Western Digital Technologies, Inc., San Jose, CA (US)

(72) Inventors: Stella Achtenberg, Netanya (IL); Ran Zamir, Ramat Gan (IL); Ofir Pele, Netanya (IL); Omer Fainzilber, Herzeliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 253 days.

(21) Appl. No.: 16/918,837

(22) Filed: Jul. 1, 2020

(65) Prior Publication Data

US 2022/0004456 A1    Jan. 6, 2022

(51) Int. Cl.
| | | |
|---|---|---|
| H03M 13/27 | (2006.01) | |
| H03M 13/09 | (2006.01) | |
| H04L 1/00 | (2006.01) | |
| G06F 11/10 | (2006.01) | |
| G06N 20/00 | (2019.01) | |
| G11C 16/34 | (2006.01) | |
| G11C 16/26 | (2006.01) | |
| G11C 16/10 | (2006.01) | |
| G06N 5/04 | (2006.01) | |

(52) U.S. Cl.
CPC .......... *G06F 11/1068* (2013.01); *G06N 5/04* (2013.01); *G06N 20/00* (2019.01); *G11C 16/10* (2013.01); *G11C 16/26* (2013.01); *G11C 16/3495* (2013.01)

(58) Field of Classification Search
CPC ...... G06F 11/1068; G06N 5/04; G06N 20/00; G11C 16/10; G11C 16/26; G11C 16/3495
See application file for complete search history.

(56) References Cited

U.S. PATENT DOCUMENTS

| | | | |
|---|---|---|---|
| 7,174,354 B2 | 2/2007 | Andreasson | |
| 10,418,097 B2 * | 9/2019 | Avraham | ............ G11C 29/028 |
| 10,446,242 B2 | 10/2019 | Achtenberg et al. | |
| 10,564,900 B2 | 2/2020 | Achtenberg et al. | |
| 2015/0242143 A1 * | 8/2015 | Kim | ............ G11C 16/349 714/704 |
| 2021/0241845 A1 * | 8/2021 | Li | ............ G11C 29/028 |
| 2021/0344356 A1 * | 11/2021 | Berman | ............ G11C 16/0483 |

* cited by examiner

*Primary Examiner* — Guy J Lamarre
(74) *Attorney, Agent, or Firm* — Patterson & Sheridan, LLP; Steven H. VerSteeg

(57) ABSTRACT

A method of temperature compensation to read a flash memory device includes determining a state of the flash memory device. An action is selected with a maximum Q-value from a Q-table for the current state during exploitation. A read operation of a code word from the flash memory device is conducted using one or more parameters according to the selected action. The code word is decoded with an error correction code (ECC) process.

20 Claims, 11 Drawing Sheets

MACHINE LEARNING FOR TEMPERATURE COMPENSATION

BACKGROUND

This disclosure generally relates to data storage devices and more particularly to machine learning for temperature compensation (TC) to read flash memory devices.

Non-volatile data storage devices, such as flash memory devices, have allowed for increased portability of data and software applications. Flash memory devices can enhance data storage density by storing multiple bits in each flash memory cell. For example, flash memory devices provide increased storage density by storing 2 bits per cell (i.e., MLC cells), 3 bits per cell (i.e., TLC cells), 4 bits per cell (i.e., QLC cells), or more. Although increasing the number of bits per cell increases the storage density of a flash memory device, a bit error rate (BER) of data stored at the flash memory device may also increase.

In addition, increased BER due to temperature changes between a program temperature (e.g., the temperature of the flash memory device when data is written to the flash memory device) and a later read temperature (e.g., the temperature of the flash memory device when the data is read from the flash memory device) is becoming an increasingly significant issue. Because each storage element may have a distinct cross temperature coefficient, each storage element may exhibit a different threshold voltage (Vt) shift due to a temperature change relative to the temperature at which the storage element was programmed and verified. The Vt shift per storage element is a function of the temperature difference. As a result, reading a flash memory device at a different temperature than the programming temperature results in shifting and widening of the cell voltage distributions (CVDs) of the different states of the flash memory device and in an increased BER. Shifting and widening of the CVDs and increased BER arises in both temperature change directions, such as when data is read from storage elements at a higher temperature than the data was written to the storage elements and also when the data is read from storage elements at a lower temperature than the temperature at which the data was written to the storage elements.

One previous approach for temperature compensation of flash memory devices includes a search over flash memory device parameters, such as multiple simple reads with different default parameters values followed by thresholds calibration and bit error rate (BER) estimation. The search is stopped once the BER of the code word is low enough to be decoded and a successful decode is achieved. However, this search may have a long latency. Therefore, there is a need for an improved method of managing temperature compensation of flash memory devices.

SUMMARY

In one embodiment, a method of temperature compensation to read a flash memory device includes determining a state of the flash memory device. An action is selected with a maximum Q-value from a Q-table for the current state during exploitation. A read operation of a code word from the flash memory device is conducted using one or more parameters according to the selected action. The code word is decoded with an error correction code (ECC) process.

In one embodiment, a data storage device includes a memory die. A circuit bounded array (CbA) is coupled to the memory die. The CbA includes Q-learning logic comprising a BER estimation module, a Q-table and a Q-learning process configured to converge to the agent's optimal policy and to update the Q-table values. The Q-learning logic is operable to determine a current state of the flash memory device, select an action with a maximum Q-value from the Q-table for the current state during exploitation, and conduct a read operation of a code word from the memory die using one or more parameters according to the selected action.

In another embodiment, a data storage device includes a memory die. A controller is coupled to the memory die. The controller includes a BER estimation module; a Q-table; and an ECC engine. The controller is operable to determine a current state of the memory die, select an action with a maximum Q-value from a Q-table for the current state during exploitation, conduct a read operation of a code word from the memory die using one or more parameters according to the selected action, and decode the code word with the (ECC) engine.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
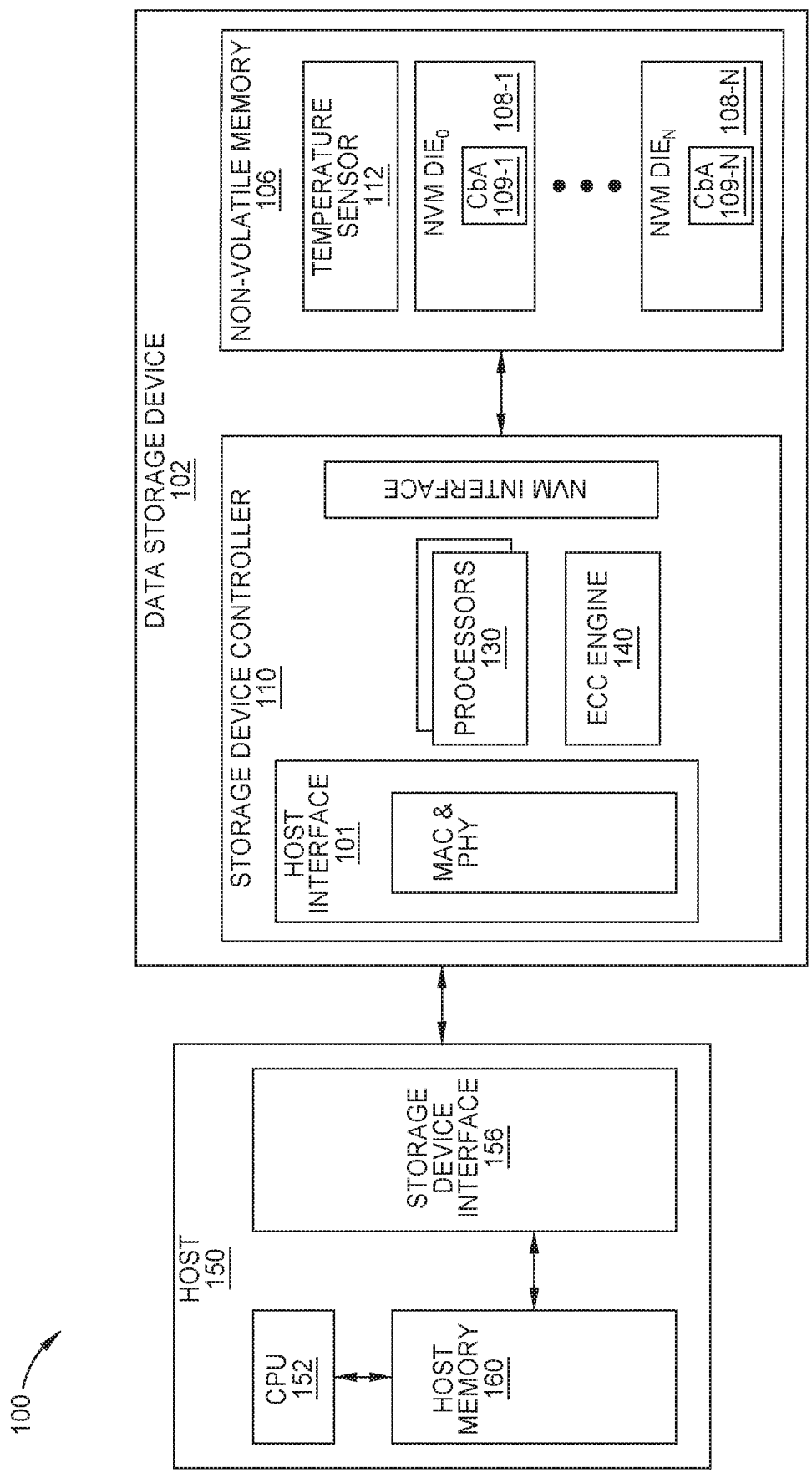
FIG. 1 is a schematic block diagram illustrating certain embodiments of a computer system including a host connected to a data storage device.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of a data storage device are operable to utilize machine learning (ML) for temperature compensation to read flash memory devices. The machine learning can be implemented in the logic implemented on a circuit bounded array coupled to the flash memory die or on the storage device controller. The machine learning process determines the environment state of the flash memory die and selects one of a plurality of read actions corresponding to the state. Each read action comprises at least one TC parameter with default threshold voltages or with threshold voltage compensation. A read of a code word from the flash memory die is conducted using the selected parameters and threshold voltages of the selected read action. The code word is decoded by an error correction code (ECC) process if the estimated BER of the code word is at or below a decoding limit. Another read action is selected if the estimated BER of the code word is above a decoding limit. Read actions are selected based upon an accumulative reward of read actions leading to a successfully decode with a target to reduce accumulative decoding latency over a plurality of read operations to the flash memory device.

The selection of TC parameters is determined by a Markov Decision Process (MDP) where the target is to minimize accumulative decoding latency. The ML process can be a reinforcement learning (RL) process to solve a MDP by maximizing an accumulative reward. The RL process selects with high accuracy and with low accumulative decoding latency the TC parameters for a plurality of environment states of a plurality of read operations of the flash memory device by default threshold voltages and by threshold voltage calibration. In certain embodiments, RL with offline training helps to provide TC parameters during an early lifetime of the flash memory device. In certain aspects, RL with online training helps to accommodate variance and changes in the flash memory device over its lifetime. The RL process can be performed by logic implemented on each flash memory device, such as on each NAND flash memory die, or can be implemented on the storage device controller.

FIG. 1 is a schematic block diagram illustrating certain embodiments of a computer system 100 including a data storage device 102, such as a solid state drive (SSD), connected to a host 150. Host 150 utilizes a non-volatile memory (NVM) 106, such as flash memory devices, included in data storage device 102 to write and to read data, such as for long term memory storage.

Host 150 can be a hardware platform including one or more central processing units (CPUs) 152, a storage device interface 156, and host memory space 160. Host 150 may include a wide range of devices, such as computer servers, network attached storage (NAS) units, desktop computers, notebook (e.g., laptops) computers, tablet computers (e.g., "smart" pads), mobile devices, set-top boxes, telephone handsets (e.g., "smart" phones), televisions, cameras, display devices, digital media players, video gaming consoles, video streaming devices, and automotive applications (e.g., mapping, autonomous driving). In certain embodiments, host 150 includes any device having a processing unit or any form of hardware capable of processing data, including a general purpose processing unit, dedicated hardware (such as an application specific integrated circuit (ASIC)), configurable hardware such as a field programmable gate array (FPGA), or any other form of processing unit configured by software instructions, microcode, or firmware.

Host memory space 160 is a device allowing information, such as executable instructions, cryptographic keys, configurations, and other data, to be stored and retrieved. Host memory space 160 can be DRAM, SRAM, other main memories, and combinations thereof. An application program may be stored to host memory space 160 for execution by components of host 150.

Data storage device 102 may be a network storage device, an internal storage drive (e.g., server computer, desktop hard drive, notebook computer), a data center storage device, an external storage device, an embedded mass storage device, a removable mass storage device, and other suitable data storage devices.

Host 150 can be connected to the storage device 102 over a wired link, a wireless link, a data center storage system network, an enterprise storage system network, a storage area network, a cloud storage network, a local area network (LAN), a wide area network (WAN), the Internet, other networks, and interconnections thereof.

In certain embodiments, the storage device interface 156 can be a dedicated link between host 150 and data storage device 102. The storage device interface 156 of host 150 interacts with a host interface 101 of the data storage device 102 for ingress and egress of communications between host 150 and data storage device 102. In certain embodiments, the storage device interface 156 can be a network interface. Network interface enables host 150 to communicate with data storage device 102 via a communication medium, such as a network coupling host 150 and data storage device 102 within the computer system 100. Network interface may be one or more network adapters, also referred to as Network Interface Cards (NICs). Storage device interface 156 and host interface 101 operate under a communication protocol, such as a Peripheral Component Interface Express (PCIe) serial communication protocol, Universal Flash Storage (UFS), a serial advanced technology attachment (SATA), serial attached SCSI (SAS), or other suitable communication protocols.

Data storage device 102 includes a storage device controller 110 that manages operations of storage device 102, such as writes to and reads from NVM 106. In certain embodiments, storage device controller 110 include an error correction code (ECC) engine 140 to decode data stored in NVM 106. For example, ECC engine 140 may use parity data to decode data using any suitable decoding algorithm. The RL process for TC increases the accuracy and/or decreases the accumulative decoding latency by the ECC engine 140. For example, the RL process for TC can reduce the number iterations of an iterative decoding algorithm of the ECC engine 140 to arrive at a valid code word and/or the RL process for TC can enable use of a less powerful ECC engine 140.

Storage device controller 110 may include one or more processors 130, which may be multi-core processors. Processor 130 handles the components of data storage device 102 through firmware and/or software. Processor 130 executes instructions of the computer-readable program code of the firmware and/or software. Storage device controller 110 implements the processes described herein by execution of instructions by the processor 130, by hardware, or by combinations thereof. Hardware can include various components of storage device controller 110, such as logic gates, switches, application specific integrated circuits (ASICs), programmable logic controllers, embedded microcontrollers, registers, and other components.

NVM 106 of storage device 102 may be configured for long-term storage of information as non-volatile memory space and retains information after power on/off cycles. Data stored to the NVM 106 may also include metadata, such as a write temperature and/or parity check codes associated with the stored data. NVM 106 comprises a plurality of NVM dies 108 of flash memory devices, such as, for example, NAND flash memory dies. The flash memory devices comprise arrays of single-level memory cells (SLC) storing one bit of memory per cell, multiple-level memory cells (MLC) storing two bits of memory per cell, triple-level memory cells (TLC) storing three bits of memory per cell, quad-level memory cells (QLC) storing four bits of memory per cell, or other level memory cell technologies now known, in development, or later developed, such as five-level cell memory cells.

NAND flash memory devices are fabricated in two-dimensional or three-dimensional architectures. Temperature cross issues in NAND flash memory devices based on three-dimensional architectures are exacerbated due to use of a charge trap as opposed to a floating gate in NAND flash memory devices based on two-dimensional architectures. Each memory cell of a 3D NAND memory array may have its own different cross temperature coefficient and may exhibit a different Vt shift due to a change (i.e., cross temperature) in programming temperature and read temperature. 3D NAND memory arrays result in an increased shifting and widening of the CVD distributions of the different states and increased BER due to cross temperature issues in comparison to 2D NAND memory arrays. In other embodiments, NVM 106 may be other non-volatile memories, such as NOR flash memory devices.

The RL for TC can be implemented in a circuit bounded array (CbA) 109 associated with each of the NVM dies 108 or implemented on the storage device controller 110. NVM 106 includes a temperature sensor 112. The temperature sensor 112 is configured to measure an environment temperature. For example, the temperature sensor 112 can provide a measured temperature, such as a read temperature, to the CbA 109 and/or to the storage device controller 110. NVM 106 can include a single temperature sensor 112 or can include multiple temperatures sensors 112. For example, in certain embodiment of NVM 106, each of the NVM dies 108 may include a separate temperature sensor 112.

Embodiments described herein are not limited to three dimensional memory arrays described, but cover all relevant memory structures as understood by one of skill in the art. Embodiments described herein are not limited to NAND flash memory devices, but cover all relevant memory devices, such as NOR flash devices, ReRAM memory cells, or other memory arrays made of storage class memory. Multiple memory dies, such as same type or mixed types of memory arrays, may be coupled together to form the NVM 106 of the data storage device 102.

Figure 2:
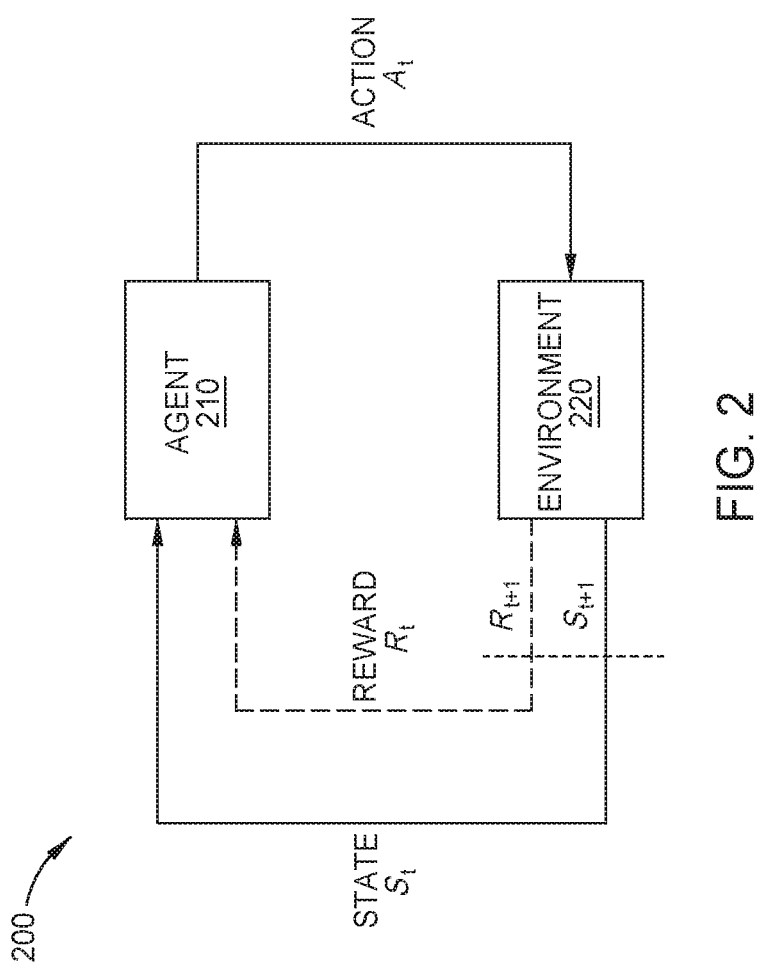
FIG. 2 is a schematic illustration a recursive Reinforcement Learning (RL) process for TC of an agent choosing an action for a current environment state as a Markov Decision Process.

FIG. 2 is a schematic illustration of a recursive RL process 200 for TC of an agent 210 choosing an action for a current environment state 220 as a MDP, where the target is to minimize accumulative decoding latency. RL solves MDP problems by maximizing an accumulative reward. In other embodiments, other ML, such as supervised learning or unsupervised learning, can be used to solve the MDP problems. In certain embodiments, the agent 210 is the Q-learning logic coupled to the NAND flash memory die, and the environment is the NAND flash memory die. In certain embodiments, the agent 210 is the storage device controller, and the environment is the NAND flash memory die.

The agent 210 selects an action based on the state of the environment 220 and maximizing accumulative rewards. The selected action impacts the current reward and future rewards. The agent 210 takes actions which in turn changes the state of the environment 220 and provides a reward. If the sum of the immediate reward plus the next state's expected total reward is high, the agent 210 would learn to prefer more of the same action in this state. Otherwise, other actions may be chosen in the future. The Q-learning process is configured to converge to the agent's optimal policy and update the Q-table values accordingly. After convergence to the optimal policy, the converged action the agent selects in each state is the action with the maximal Q value in the Q-table. Convergence to the optimal policy may be achieved by offline training in the lab during production or on-the-fly in the field.

Additionally, such as in an early lifetime of the NAND flash memory die when the estimates of expected total rewards for next states may not be accurate, the agent 210 uses an exploration value, such as an epsilon-greedy value of $0<\varepsilon<1$ to provide the agent 210 a chance to explore new actions versus exploitation of the current action. For example, during exploration, the agent 210 selects an action using a probability of $p=1-\varepsilon$.

The RL process 200 learns from experience interacting with the respective states of the environment 220 of the memory die for a plurality of read operation to select respective actions that result in decoding success with low accumulative decoding latency. The RL process 200 selects an action using rewards. Actions that receive higher rewards would be preferred over actions with smaller rewards over time. In certain embodiments, the recursive RL process 200 finds and delivers the TC parameters in combination with default threshold voltages or calibrated threshold voltages resulting in decoding success with low accumulative decoding latency.

In certain embodiments, the RL process 200 is a Q-Learning process with a quantized representation of the states using tiling and linear function approximation. For example, instead of representing a characteristic of an environment state as a single number, the characteristic is represented as a plurality of values alone or in combination with other characteristics. In certain aspects, Q-learning can provide constraints that correspond one or more characteristics to atomic actions that are less time consuming. In certain aspects, Q-learning provides a plurality of action corresponding to an environment state that can be selected with negligible run time.

The goal of Q-learning is to learn the optimal policy, which tells the agent 210 what action to take under what circumstances (e.g., states). Q-learning does not require a model of the environment. One example of an Q-learning recursive formula is shown in formula (I), although other Q-learning recursive formulas may be used:

$$Q^{new}(S_t,A_t) \leftarrow Q^{current}(S_t,A_t) + \alpha [R_{t+1} + \gamma \max Q(S_{t+1},a) - Q(S_t,A_t)] \quad (I)$$

The term $Q^{current}(S_t, A_t)$ is the Q-value for the current state-action pair. The term α is the learning rate. The term γ is the discount factor. The term max $Q(S_{t+1}, a)$ is the maximum expected reward given new state $S_{t+1}$ and all possible actions for that state. The term $Q^{new}(S_t, A_t)$ is the updated Q-value for the current state-action pair.

The environment states $S_t$ may include various characteristics of the memory cells of the NAND flash memory die. In certain embodiments, the environment states $S_t$ comprises one or more of the following characteristics: TC parameters of a current state, TC parameters of a previous state, time after programing, programing temperature, read temperature, a number of program/erase cycle of the block of NAND flash memory die, syndrome weight (SW) of the number of failed party check equations of a current state, syndrome weight of a previous state, decoding process of the ECC engine resulting in decoding success, other suitable characteristics, and quantizations of thereof.

TABLE I shows an example of Q-values of a Q-table with an "n" number of states corresponding to an "m" number of actions. The Q-table can include any number of states corresponding to any number of actions.

TABLE I

| State | A1   | A2   | A3   | ... | Am   |
|-------|------|------|------|-----|------|
| S1    | −0.9 | −0.5 | −0.1 | ... | −1.3 |
| S2    | −0.8 | −0.3 | −0.5 | ... | −1.5 |
| .     | .    | .    | .    | ... | .    |
| .     | .    | .    | .    | ... | .    |
| .     | .    | .    | .    | ... | .    |
| Sn    | −0.2 | −0.5 | −0.9 | ... | −2.5 |

The Q-table provides an accumulative reward about the states and actions. The Q-table is updated by the selected action and the resulting reward on whether the selected action leads to decoding success. For example, the Q-table is updated by the individual experiences of a NVM 106 of a data storage device 102 usage by the host 150 in the field. The new experiences of the NVM 106 in the field further update the Q-table. After convergence of the multiple iterations of Q-learning, each state has an action with a maximum Q-value resulting in decoding success with low accumulative decoding latency. In other embodiments, the Q-learning utilizes a function approximation, such as a neural network, instead of a Q-table. Q-learning using a Q-table or a neural network can be performed by logic implemented with each of the NVM die 108 or on the storage device controller 110.

Figure 3A:
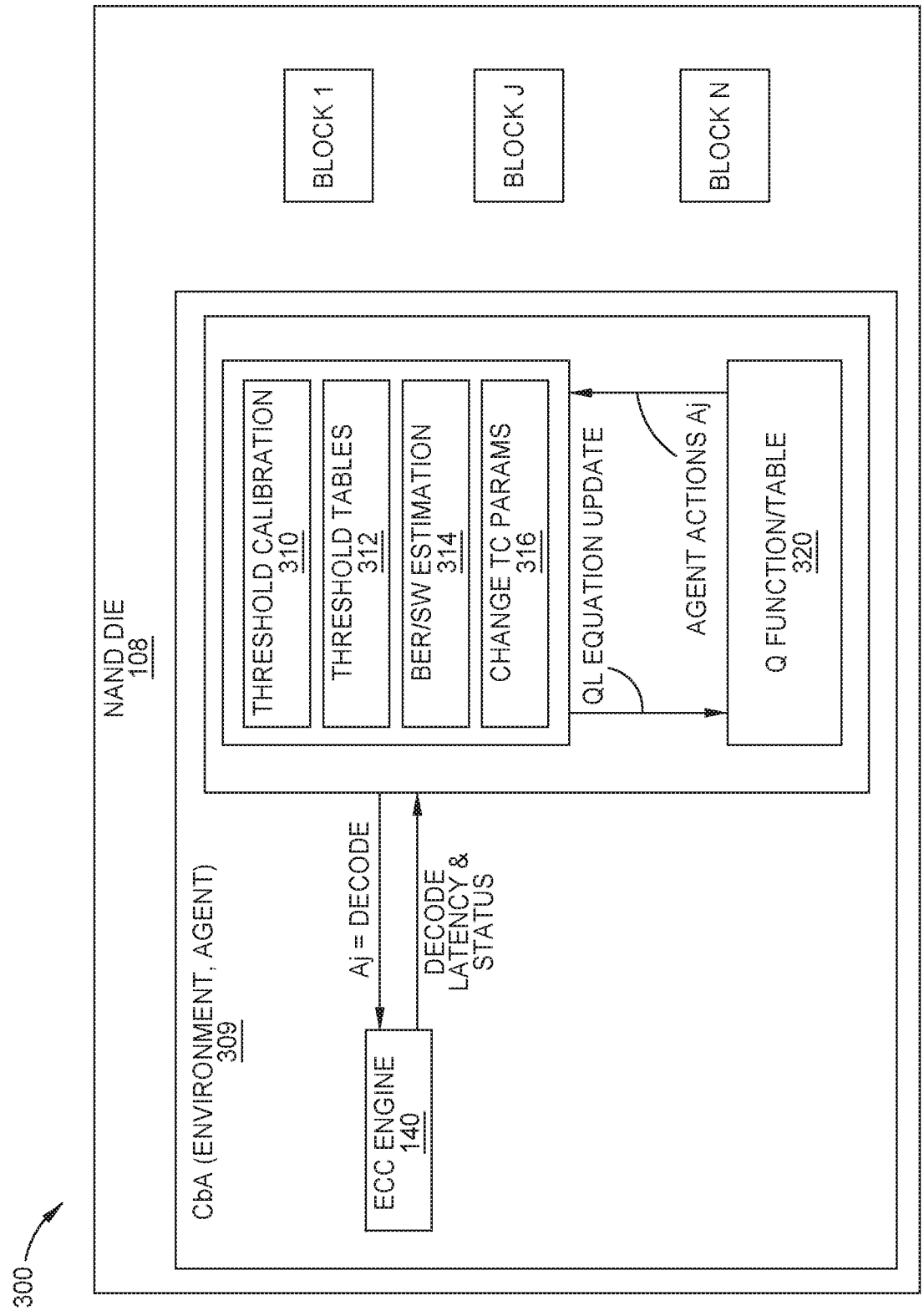
FIGS. 3A-3C are schematic illustrations of certain embodiments of Q-learning logic performing a Q-learning process for TC to read a flash memory die.
Figure 3B:
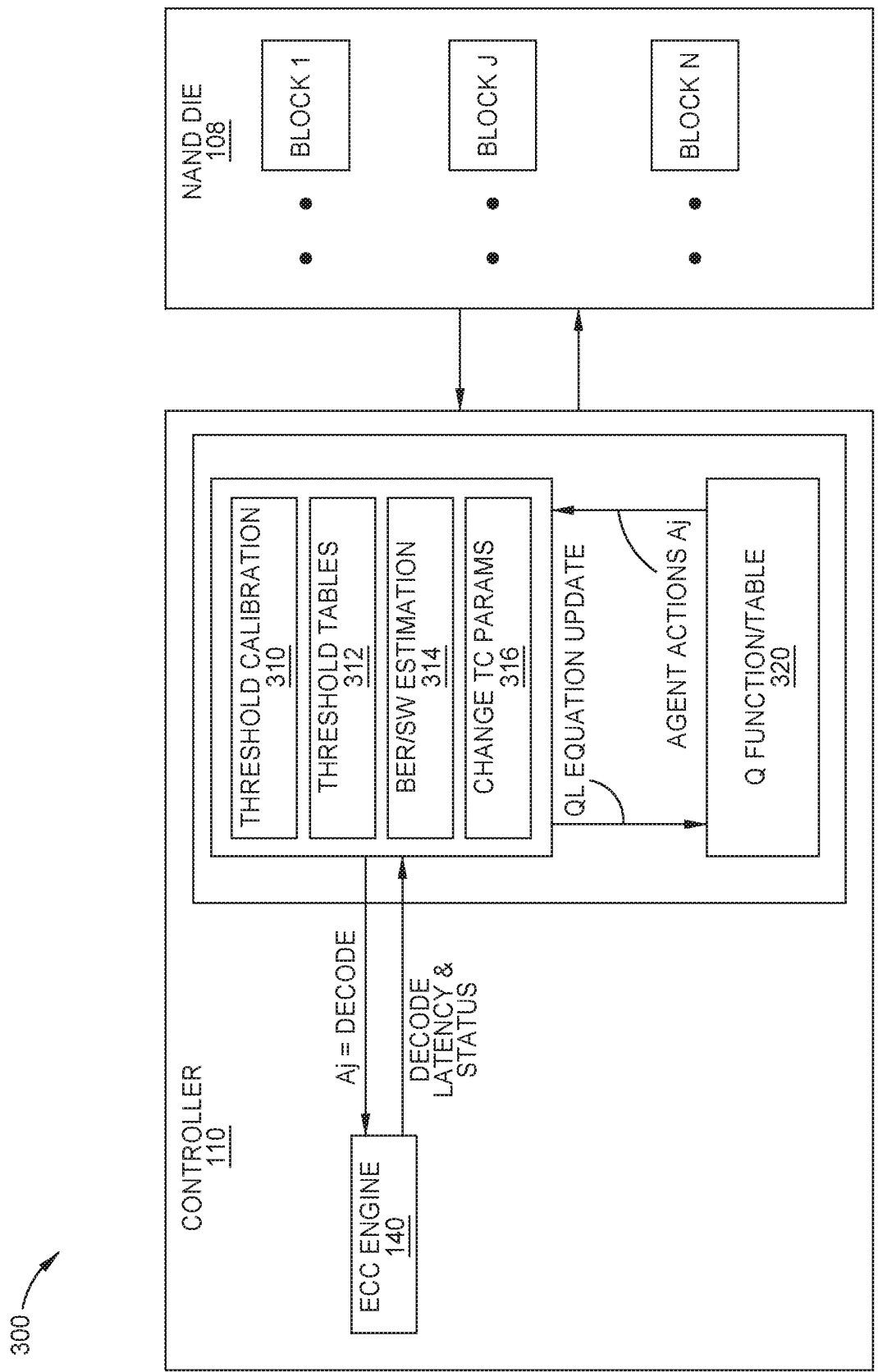
Figure 3C:
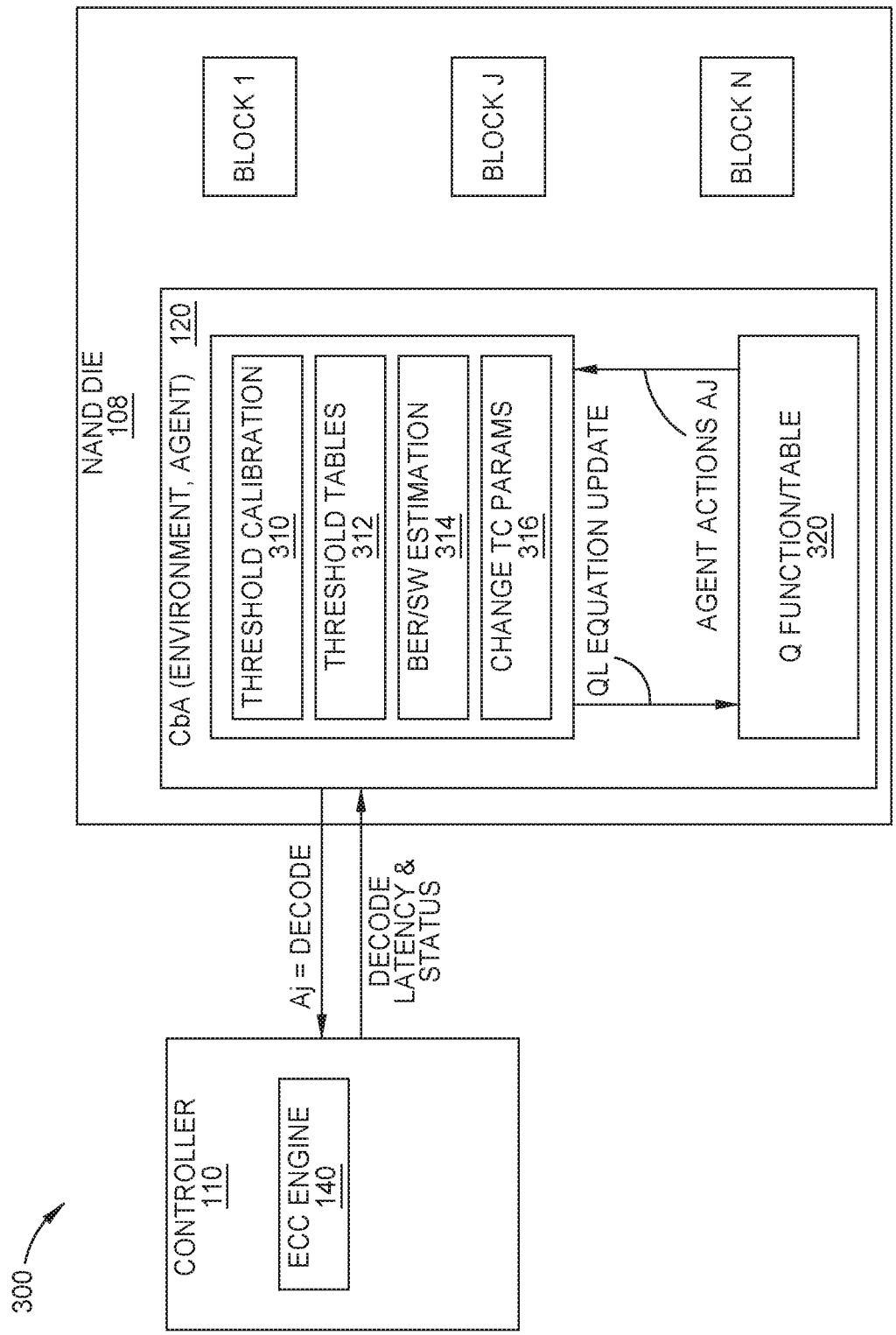

FIGS. 3A-C are schematic illustrations of certain embodiments of Q-learning logic 300 for performing a recursive Q-learning process for TC to read a NAND flash memory die. For ease of description, the Q-learning logic 300 is described in reference to implementation in the data storage device 102 of FIG. 1 although the Q-learning logic 300 can be implemented in any suitable data storage device. In certain embodiments, the Q-learning logic 300 can be continuously running (e.g., always on) during use of the data storage device 102 without a triggering event. In certain embodiments, the Q-learning logic 300 can be triggered by a triggering event, such as a temperature difference between the read temperature and the program temperature of the stored data higher than a threshold, by a decoding failure of the ECC engine 140, by request from the host 150, by recovery mode, by NAND die management mode, or by other triggering events.

In certain embodiments, the Q-learning logic 300 includes a threshold calibration module 310, default threshold table 312, a BER estimation module 314, a change in temperature compensation parameters module 316, and a Q-table 320. In certain embodiments, the Q-table 320 includes a set of plurality of actions using default threshold voltages and a set of a plurality action using threshold calibration.

The Q-learning agent determines the current environment state. Based upon the current environment state, the Q-learning agent selects an action from a plurality of actions corresponding to the state. The action with a maximum Q-value for the current environment state is typically selected. With the target to minimize accumulative decoding latency, the Q-learning agent selects a read action, such as a first read action, with one or more TC parameters to read the data using default threshold voltages or using calibrated threshold voltages. In embodiments where the Q-learning logic 300 is continuously running, the current environment state is the state of the flash memory device for a previous read access of the NAND flash memory die 108 for a sequential or a random read operation. The selected read action from the Q-table 320 determines the next state.

In the embodiment of FIG. 3A, the Q-learning logic 300 is implemented on an individual circuit bounded array (CbA) 309 coupled to each NAND flash memory die 108. For example, there are "N" number of CbAs 309 for "N" number of NAND flash memory dies 108. One CbA 309 is coupled to one NAND flash memory die 108 as shown in FIG. 3A. In the embodiment of FIG. 3A, the CbA 309 further includes an ECC engine 140. In other embodiments, the Q-learning logic can be coupled to the NAND flash memory die by other architectures besides using a CbA architecture, such as other chip stacking architectures.

In the embodiment of FIG. 3B, the Q-learning logic 300 is implemented on a storage device controller 110 coupled to a plurality of NAND flash memory die 108. For example, there is an individual device controller 110 coupled to a plurality of NAND flash memory die 108. In the embodiment of FIG. 3B, the storage device controller 110 further includes an ECC engine 140.

In the embodiment of FIG. 3C, the Q-learning logic 300 is implemented on an individual circuit bounded array (CbA) 309 coupled to each NAND flash memory die 108. For example, there are "N" number of CbAs 309 for "N" number of NAND flash memory dies 108. One CbA 309 is coupled to one NAND flash memory die 108 as shown in FIG. 3C. In the embodiment of FIG. 3C, the storage device controller 110 includes an ECC engine 140. In other embodiments, the Q-learning logic can be coupled to the NAND flash memory die by other architectures besides using a CbA architecture, such as other chip stacking architectures.

For the embodiments of the Q-learning logic 300 of FIGS. 3A-3C, if a selected action is from the set of plurality of actions using default threshold voltages, the Q-learning agent utilizes the TC parameters of the selected action with default threshold voltages from default threshold table 312 to read the data from the NAND flash memory die 108. If a selected action is from the set of plurality of actions using threshold calibration, the RL agent activates the threshold calibration module 310 using the TC parameters of the selected action to calibrate the threshold voltages and to utilize the calibrated threshold voltages to read the data from the NAND flash memory die 108. The threshold calibration module 310 can calibrate the threshold voltages by a valley search between the distributions of memory states or other threshold voltage calibration methods of the memory cells of the NAND flash memory die 108.

The code word read from using default threshold voltages or from using calibrated threshold voltages are used by BER estimation module 314. The BER estimation module 314 estimates the BER of the code word. The BER estimation module 314 determines an estimated BER by the number of unsatisfied parity checks or by other BER estimation methods. If the estimated BER is at or below a decoding limit, the code word is transferred to the ECC engine 140 for decoding. The ECC engine 140 utilizes any suitable decoding algorithm to decode the code word, such an iterative low-density parity-check (LDPC) algorithm. If the estimated BER is above a decoding limit or if the ECC engine 140 fails to decode the code word, another read action, such as a second read action, yet to be selected in the current episode of Q-learning is selected from the Q-table 320 until the episode of the Q-learning agent is terminated by successful decode or timeout.

The Q-table 320 is updated to reflect positive rewards for a selected action resulting in decoding success and to reflect negative rewards for a selected action with a high estimated BER or resulting in a decoding failure. The Q-table 320 can be updated to minimize accumulative decoding latency associated with estimated BERs. Typically, an action with a low estimated BER would have low latency. There could be instances where, an action with a low latency has a higher Q-value in comparison to an action with a lower estimated BER but with a high latency.

Certain embodiments of using Q-learning for choosing the TC parameters of a plurality of environment states includes offline training of the TC parameters and online training of the TC parameters. In certain embodiments, offline training is conducted by the manufacturer of the data storage device 102. In certain embodiments, online training is conducted in the field by usage of the data storage device 102 by a particular host 150. In certain aspects, the default threshold voltages help the Q-learning to provide TC parameters at the beginning of the lifetime of the data storage device 102. In certain aspects, the calibrated threshold voltages enable the Q-learning to provide TC parameters accommodating variance and changes over the lifetime of the data storage device 102. The Q-learning process of TC having both offline training and online training lowers the accumulative decoding latency. The Q-learning process 300 for TC can be implemented on a CbA 309 including an ECC engine 140 as shown in FIG. 3A, on a storage device controller 110 including an ECC engine 140 as shown in FIG. 3B, or on CbA 309 with an ECC engine 140 included in a storage device controller 110 as shown in FIG. 3C. Implementing the Q-learning logic 300 on CbA 309 as shown in FIGS. 3A and 3C reduces the amount of data transferred to the storage device controller 110 and thus further reduces accumulative decoding latency as well as reducing the bandwidth usage and power consumption of the storage device controller 110. When the Q-learning logic 300 is implemented on a CbA 309, determining an estimated BER can be done without transferring the code word to the storage device controller 110.

Figure 4:
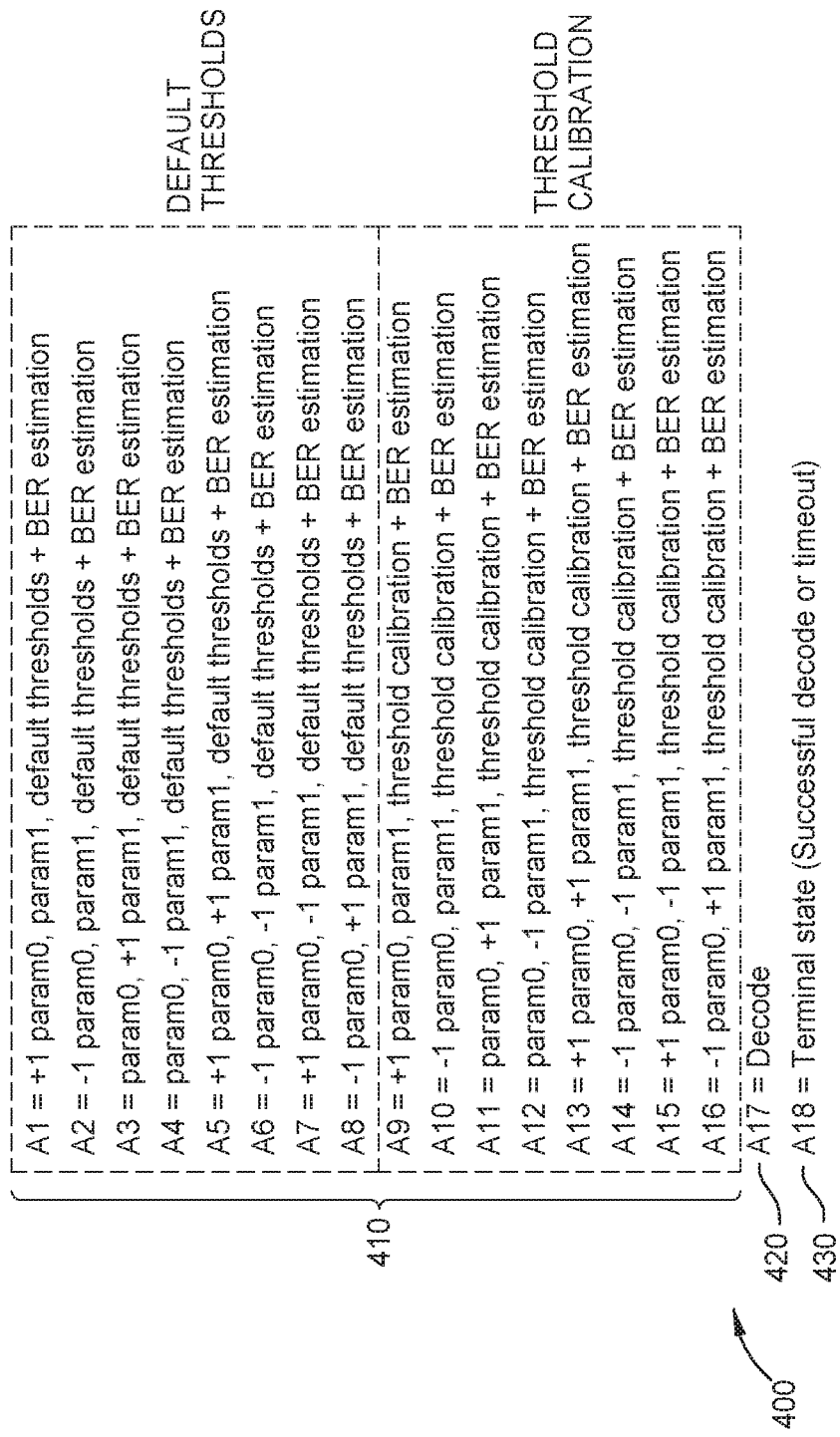
FIG. 4 is a schematic illustration of certain embodiments a set of agent actions that are selected from a Q-table.

FIG. 4 is a schematic illustration of certain embodiments of a set of agent actions 400 that are selected from a Q-table. The set of agent actions 400 includes a plurality of read actions 410, a decode action 420, a terminal state action 430, and other suitable actions. Through online learning, the Q-table is updated based on the recursive Q-learning and exploration as part of continuous online training by usage of the data storage device.

Each of the plurality of read actions 410 shows two TC parameters in which each parameter is individually adjusted to one of three states to set a sense read of the flash memory device. Each TC parameter is an access parameters that reduces temperature-based effects at the data storage device. One example of a TC parameter a bit line voltage (e.g., VBLC). Another example of a TC parameters is a sense amplification time (e.g. SEN2) of the duration of a time interval used for charging a capacitor of a sense amplifier during a read operation. For example, param0 is a bit line clamping voltage (VBLC) parameter and parameter1 is a SEN2 parameter. VBLC clamps the bit line voltage during sensing and is typically set to approximately a threshold voltage above the desired bit line voltage during sensing. Node SEN2 connects the VBLC transistor to the readout bus. As shown in FIG. 4, each of the parameters can be adjusted into three states of −1 param, param, and +param. In other embodiments, each of the plurality of read actions can include any number of TC parameters, such as a single parameter or three or more parameters. In other embodiments, each of the plurality of read actions can include a parameter adjusted to one of any number of suitable states (e.g. +−j on each parameter separately).

As shown in FIG. 4, there are eight permutations of combinations of param0 and param1 corresponding to read actions A1-A8. Each of the read actions A1-A8 has an individual set of default threshold voltages to read the cell threshold voltages of the memory cells of the flash memory device. For example, a set of one default threshold voltage to demarcate two memory states of single-level cells (SLC), a set of three default threshold voltages to demarcate four memory states of multiple-level cells (MLC), a set of seven default threshold voltages to demarcate eight memory states of triple-level cells (TLC), or a set of fifteen default threshold voltages to demarcate sixteen memory states of quad-level cells (QLC). Each set of default threshold voltages of the read actions A1-A8 are pre-determined threshold voltages in which the read actions conduct a read operation without threshold voltage compensation. Threshold voltage compensation typically provides a highest performance in decoding a code word with low BER. However, through Q-learning, a read action can be conducted with default threshold voltages without conducting a threshold voltage to reduce overall accumulative decoding latency if the recursive learning Q-learning process determines that the default threshold voltages are at or near ideal read levels. The default threshold voltages can determined by offline characterization of the NAND flash memory die, by using threshold voltages determined by a prior Q-learning episode, by updating the default threshold voltages though the Q-learning, or by combinations thereof. For example, updated default threshold voltages can a moving average between the old default read thresholds and new threshold voltages from online training. The set of default threshold voltages of the read actions A1-A8 can be the same or different across the same state. The set of default threshold voltages of the read actions A1-A8 can be the same or different across different states.

As shown in FIG. 4, there are eight permutations of combinations of param0 and param1 corresponding to read actions A9-A16. Each of the read actions A9-A16 has a set of calibrated threshold voltages to read the cell threshold voltages of the memory cells of the flash memory device. For example, a set of one calibrated threshold voltage to demarcate two memory states of single-level cells (SLC), a set of three calibrated threshold voltages to demarcate four memory states of multiple-level cells (MLC), a set of seven calibrated threshold voltages to demarcate eight memory states of triple-level cells (TLC), or a set of fifteen calibrated threshold voltages to demarcate sixteen memory states of quad-level cells (QLC).

The selected read action with the specified TC parameters with the default threshold voltages of read actions A1-A8 or with calibrated threshold voltages of read actions A9-A16 impacts the estimated BER and the accumulative decoding latency. Different TC parameters with the same or different set of threshold voltages will impact the estimated BER and the accumulative decoding latency.

When the agent selects one of the plurality of read actions 410 which provides an estimated BER that is above a decoding limit, the agent selects a next read action from the plurality of read actions 410 that has yet to be selected in the current Q-learning episode.

When the agent selects one of plurality of read action 410 which provides an estimated BER that is at or below a decoding limit, the agent selects the next action of the decode action 420 by transferring the code word to the ECC engine 140. If the ECC engine 140 fails to decode the code word, the agent repeats the process of selecting a next action from the read actions 410 that have yet to be selected in the current Q-learning episode.

If selected decode action 420 results in decoding success, the agent selects the next action of terminal state action 430 to terminate the Q-learning episode. The terminal state action 430 may also be selected in event of expiration of the timeout window without a decoding success.

The agent uses a Q-table for selecting and taking an action from a plurality of actions for a particular state. The Q-table is updated with the reward resulting from taking the selected action. The reward is minus the decoding latency to minimize latency. If a selected read action has too high an estimated BER or does not result in decoding success, then another read action is selected from the Q-table if the timeout window has not expired. In certain embodiments, the Q-learning process can revert to selecting read actions A1-A8 using default threshold voltages if selecting read actions A9-A16 using threshold calibration has a high decoding failure rate or high latency.

Figure 5A:
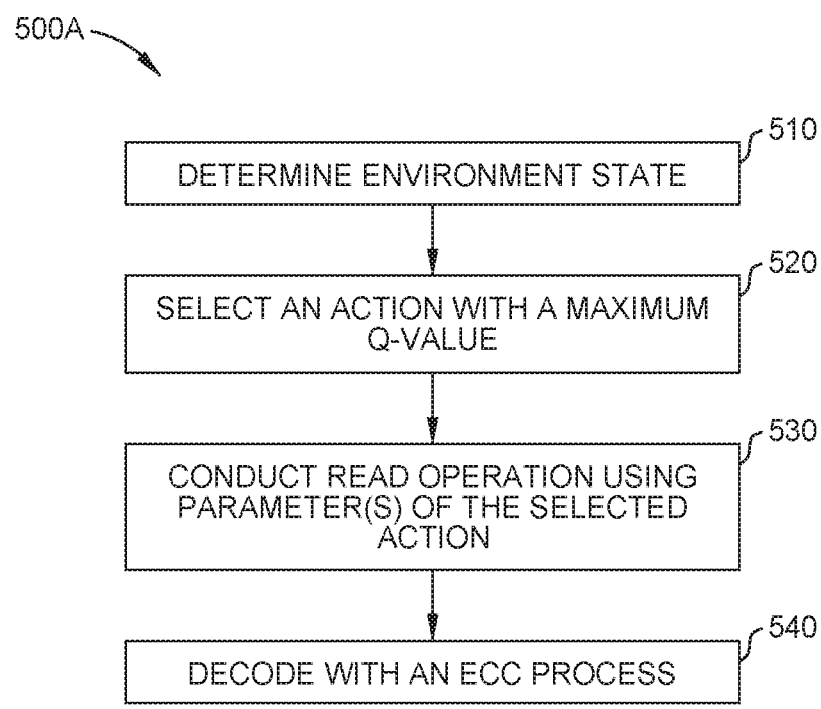
FIGS. 5A-B are schematic flow charts of embodiments of a Q-learning process for TC to read a flash memory device.

FIG. 5A is a schematic flow chart of one embodiment of a Q-learning process 500A for TC to read a flash memory device. For ease of description, the Q-learning process 500A is described in reference to the data storage device 102 of FIG. 1 although any suitable data storage device may be used. The agent of Q-learning process 500A is performed by the Q-learning logic 300 of FIGS. 3A-3C.

At block 510, the agent determines the environment state of the NAND memory cells of the NAND flash memory die 108, such as the environment state of a page or block of memory cells.

At block 520, the agent selects an action with a maximum Q-value from a Q-table for the current state during exploitation, such as a first read action, from the plurality of read actions corresponding to the environment state determined from block 510. The agent may select an action without a maximum Q-value during exploration (i.e., not during exploitation). Each of the read actions includes one or more TC parameters for a sense read of the flash memory device with either default threshold voltages or calibrated threshold voltages.

At block 530, a read operation is conducted using the one or more TC parameters of the selected action from block 520 along with either default threshold voltages or calibrated threshold voltages to conduct a read operation to determine a code word.

In certain embodiments, a BER estimation of the code word can be conducted to determine an estimated BER. The agent can further determines if the estimated BER from block 530 is above a decoding limit.

If the BER estimation is at or below a decoding limit, the agent can proceed to block 540.

If the estimated BER is above a decoding limit, the agent returns to block 510. The estimated BER from block 530 is part of the environment state of the NAND memory cells which is used in a following iteration of the Q-learning process 500A at block 510. In the following iteration of the Q-learning process 500A, the agent selects another read action from the plurality of read actions corresponding with the current environment state which has yet to be selected in the current episode of the Q-learning process 500A.

At block 540, the agent selects a decode action in which an ECC process decodes the code word from the read operation of block 530. The ECC process can be conducted on the CbA 309 of FIG. 3A, 3C or can be conducted on the storage device controller 110 of FIG. 3B. The agent receives notice from the ECC engine 140 whether or not the ECC engine 140 successfully decoded the received code word.

If the ECC engine 140 successfully decodes the code word, the Q-learning process 500A is terminated by selecting and taking a terminate state action.

If the ECC engine 140 unsuccessfully decodes the code word, the agent returns to block 510. The failed decode from block 540 is part of the environment state of the NAND memory cells which is used in a following iteration of the Q-learning process 500A at block 510. In the following iteration of the Q-learning process 500A, the agent selects another read action from the plurality of read actions corresponding with the current environment state which has yet to be selected in the current episode of the Q-learning process 500A.

Figure 5B:
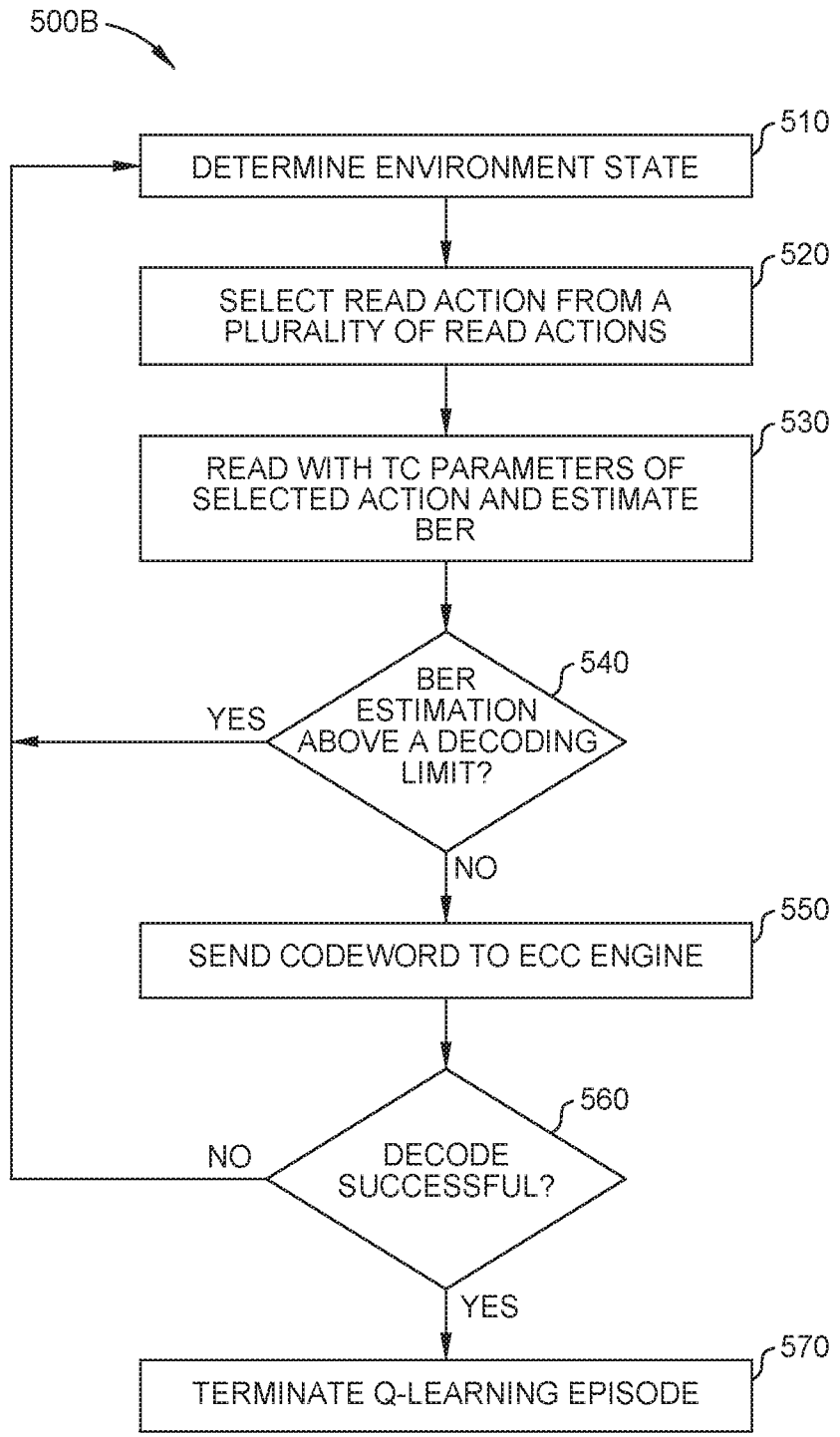

FIG. 5B is a schematic flow chart of one embodiment a Q-learning process 500B for TC to read a flash memory device. For ease of description, the Q-learning process 500B is described in reference to the data storage device 102 of FIG. 1 although any suitable data storage device may be used. The agent of Q-learning process 500B can be implemented in NAND flash memory logic 109 coupled with each NAND flash memory die 108 or implemented by a storage device controller 110.

At block 510, the agent determines the environment state of the NAND memory cells of the NAND flash memory die 108, such as the environment state of a page or block of memory cells.

At block 520, the agent selects a read action, such as a first read action, from the plurality of read actions corresponding to the environment state determined from block 510. Each of the read actions includes one or more TC parameters for a sense read of the flash memory device with either default threshold voltages or calibrated threshold voltages.

At block 530, a sense read is conducted using the TC parameters of the selected action from block 520 along with either default threshold voltages or calibrated threshold voltages conduct a sense read to determine a code word. A BER estimation of the code word is conducted to determine an estimated BER.

At block 540, the agent determines if the estimated BER from block 530 is above a decoding limit. If the BER estimation is at or below a decoding limit, the agent proceeds to block 550.

If the estimated BER is above a decoding limit, the agent returns to block 510. The estimated BER from block 540 is part of the environment state of the NAND memory cells which is used in a following iteration of the Q-learning process 500B at block 510. In the following iteration of the Q-learning process 500B, the agent selects another read action from the plurality of read actions corresponding with the current environment state which has yet to be selected in the current episode of the Q-learning process 500B.

At block 550, the agent selects and takes a decode action to transfer the code word from sense read of block 530 to the ECC engine 140. The ECC engine 140 attempts to decode the received code word. The ECC process can be conducted on the CbA 309 of FIG. 3A, 3C or can be conducted on the storage device controller 110 of FIG. 3B.

At block 560, the agent receives notice from the ECC engine 140 whether or not the ECC engine 140 successfully decoded the received code word at block 550.

If the ECC engine 140 successfully decodes the code word, the agent proceeds to block 570 in which the episode of the Q-learning process 500B is terminated by selecting and taking a terminate state action.

If the ECC engine 140 unsuccessfully decodes the code word, the agent returns to block 510. The failed decode from block 560 is part of the environment state of the NAND memory cells which is used in a following iteration of the Q-learning process 500A at block 510. In the following iteration of the Q-learning process 500A, the agent selects another read action from the plurality of read actions corresponding with the current environment state which has yet to be selected in the current episode of the Q-learning process 500B In the schematic illustrations of the Q-learning process 500A-B in FIGS. 5A-B, it is understood that each selected action (read action, decode action, terminate action, etc.) is an iteration of the recursive Q-learning process. It is understood that each selected action changes the environment state of the NAND memory cells. The agent determines the new environmental state when selecting a new action.

After successful decode or expiration of the timeout window of the Q-learning process 500A-B, the Q-table is updated to reflect a total reward. The total reward ($G_T$) to minimize accumulative decoding latency is the minus sum of latencies (R) of all selected actions until successful decode or until expiration of the timeout window. A penalty (F) can be added for a decoding failure or for expiration of the timeout window. One example of the total reward for decoder success is by formula II:

$$G_T = R_1 + R_2 + \ldots R_T \text{ if decoder success} \quad (II)$$

One example of the reward for decoder failure and timeout expiration is by formula III.

$$G_T = R_1 + R_2 + \ldots + R_T + F \text{ if decoder failed and timeout} \quad (III)$$

In one embodiment, in the case of minimizing the average accumulative decoding latency since a Q-learning episode is limited by the timeout window, Q-learning process 500A-B does not use a discounting factor so that all rewards have the same weight on the reward function. In another embodiment, in the case of minimizing the distribution of current accumulative decoding latency versus future accumulative decoding latency, the Q-learning process 500A-B includes a discounting factor. In another embodiment, the Q-learning process 500A-B include a customer reward function that depends on a time stamp. For example, exploitation of Q-learning is increased during peak usage time and exploration of Q-learning is increased during non-peak usage times.

The plurality of read actions of block 520 include a plurality of read actions with either default threshold voltages or calibrated threshold voltages. In online training, Q-learning process 500A-B learns from the updates of the Q-table/function approximation from usage of the storage device 102 in the field by a particular host 150. Online training increases reliability and performance by updating the Q-table/function approximation for flash memory device to the individual user environment states and/or to the individual wear and conditions of the flash memory device. The online training adapts to changes in the environment state and individual wear of the flash memory device by continuously updating the accumulative reward. The ability to adapt to changes in the environment states and individual wear of the flash memory device increases performance compared to the baseline TC parameters set by the manufacturer. In certain embodiments, the online training updates the default threshold voltages so that threshold voltage calibration may be skipped in the next action of the flash memory device in the same or similar environment state.

In certain aspects, the Q-learning process provides reduced accumulative decoding latency by more rapidly selecting TC parameters in comparison to a TC parameter search without Q-learning. In certain aspects, the Q-learning process with both online training and offline training provides reduced accumulative decoding latency in comparison to a Q-learning process with online training alone or with offline training alone.

Figure 6:
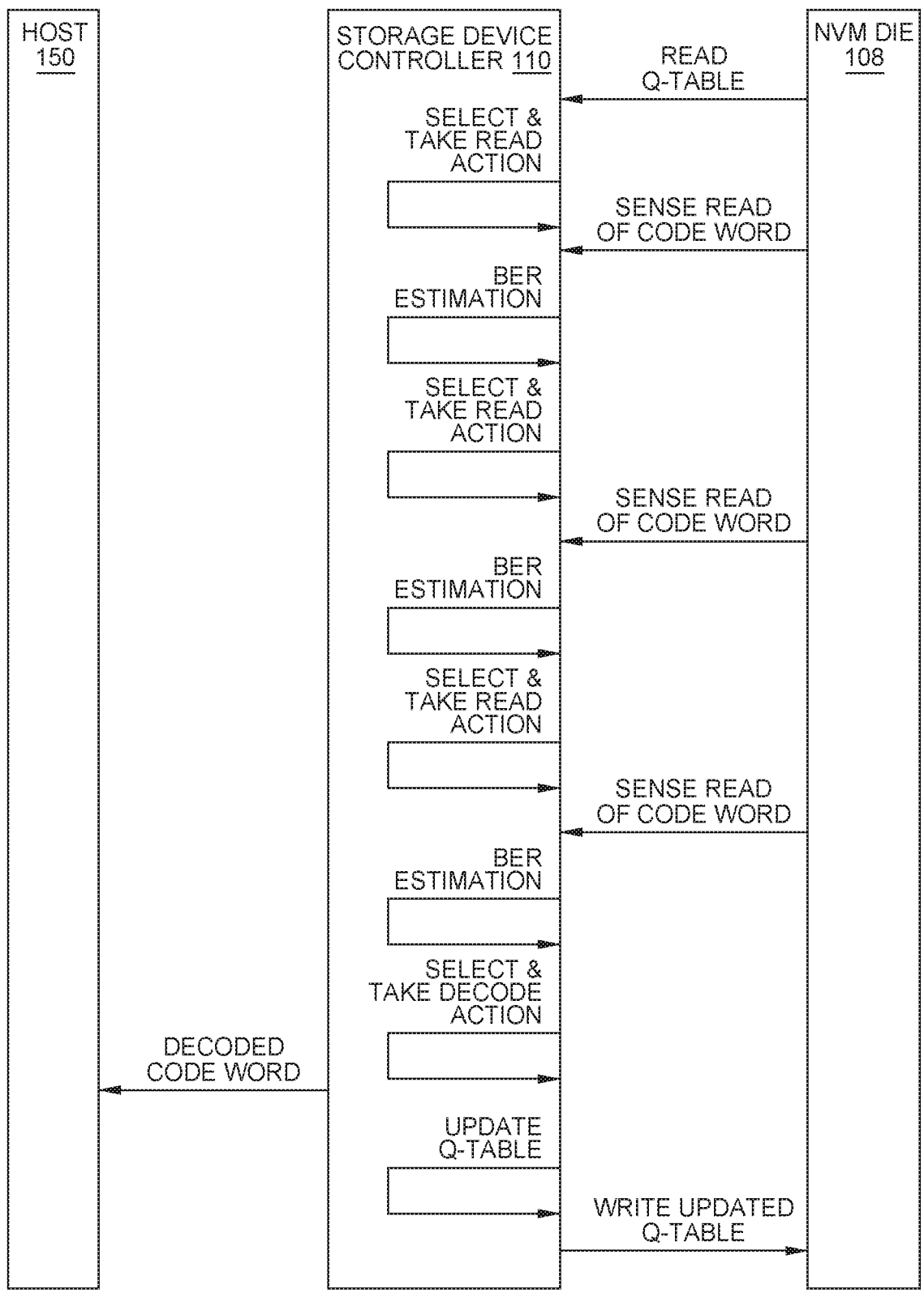
FIG. 6 is a schematic illustration of an example of certain embodiments of a recursive Q-learning process for TC performed by a storage device controller.
Figure 7:
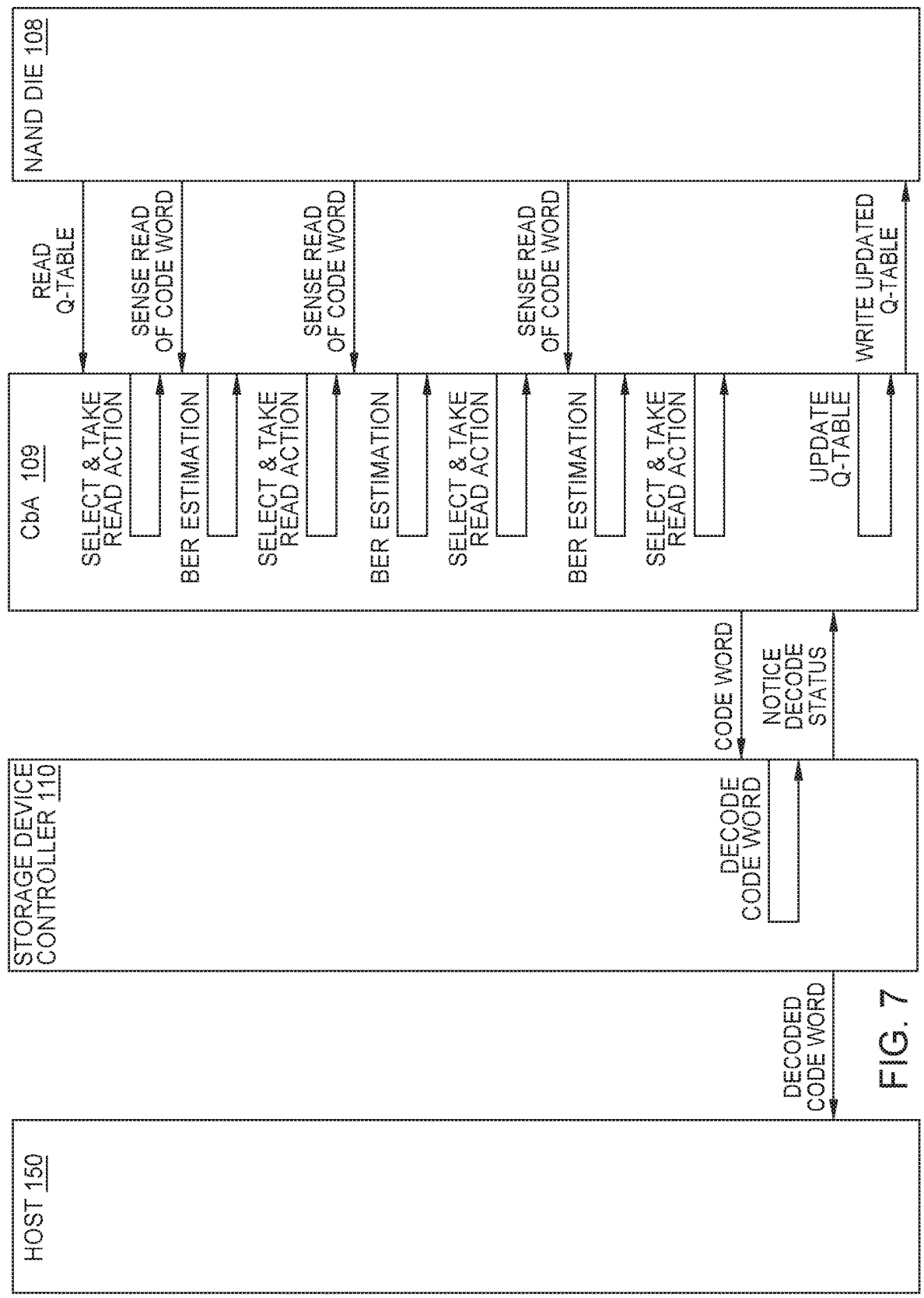
FIG. 7 is a schematic illustration of an example of certain embodiments of a recursive Q-learning process for TC performed by Q-learning logic associated with a NAND flash memory die.

FIG. 6 is a schematic illustration of an example of certain embodiments of a recursive Q-learning process 600 for TC performed by a storage device controller 110. FIG. 7 is a schematic illustration of an example of certain embodiments of a recursive Q-learning process 700 for TC performed by a CbA 109 associated with the NAND flash memory die 108. For ease of description, the Q-learning processes 600, 700 are described in reference to implementation in the data storage device 102 of FIG. 1 although the processes can be implemented in any suitable data storage device.

Both processes 600, 700 illustrates at least one episode of Q-learning for TC. In both processes 600, 700, a Q-table is read from the NVM die 108. In both processes 600, 700, the Q-learning agent selects and takes three read actions to provide a code word at or below a decoding limit. In both processes 600, 700, the Q-learning agent selects and takes a decode action to transfer the code word from the third sense read to the ECC engine 140 of the storage device controller 110. In both processes 600, 700, the Q-learning updates the Q-table based upon the success or failure of decoding the code word.

As illustrated in FIG. 6 and FIG. 7, in the Q-learning logic 300 on a CbA 109 reduces the amount of data (e.g., code words) sent to the storage device controller 110 in comparison to implementing the Q-learning process 600 in the storage device controller 110. Since less data is sent to the storage device controller 110 in Q-learning process 700 of FIG. 7, the Q-learning process 700 implemented on the CbA 109 has lower latency than Q-learning process 600 implemented on the storage device controller 110 of FIG. 6. Furthermore, when multiple NAND flash memory dies 108 are coupled to the same storage device controller 110, having the Q-learning process 700 implemented on the CbA 109 reduces a bandwidth usage of the storage device controller 110.

Embodiments of a data storage device are operable to utilize machine learning (ML) for temperature compensation to read flash memory devices. The machine learning can be implemented in the logic coupled to the flash memory die or can be implemented in the storage device controller. The machine learning process determines the environment state of the flash memory die and selects one of a plurality of read actions corresponding to the state. Each read action comprises at least one TC parameter with default threshold voltages or with threshold voltage compensation. A read of a code word from the flash memory die is conducted using the selected parameters and threshold voltages of the selected read action. The code word is decoded by an error correction code (ECC) process if the estimated BER of the code word is at or below a decoding limit. Another read action is selected if the estimated BER of the code word is above a decoding limit. Read actions are selected based upon an accumulative reward of read actions leading to a successfully decode with a target to reduce accumulative decoding latency. The ML process selects with high accuracy and with low accumulative decoding latency the TC parameters for a plurality of environment states of a plurality of read operations of the flash memory device by including offline and online training.

In one embodiment, a method of temperature compensation to read a flash memory device includes determining a state of the flash memory device. An action is selected with a maximum Q-value from a Q-table for the current state during exploitation. A read operation of a code word from the flash memory device is conducted using one or more parameters according to the selected action. The code word is decoded with an error correction code (ECC) process.

In one embodiment, a data storage device includes a memory die. A circuit bounded array (CbA) is coupled to the memory die. The CbA includes Q-learning logic comprising a BER estimation module and a Q-table. The Q-learning logic is operable to determine a current state of the flash memory device, select an action with a maximum Q-value from the Q-table for the current state during exploitation, and conduct a read operation of a code word from the memory die using one or more parameters according to the selected action.

In another embodiment, a data storage device includes a memory die. A controller is coupled to the memory die. The controller includes a BER estimation module; a Q-table; and an ECC engine. The controller is operable to determine a current state of the memory die, select an action with a maximum Q-value from a Q-table for the current state during exploitation, conduct a read operation of a code word from the memory die using one or more parameters according to the selected action, and decode the code word with the (ECC) engine.

EXAMPLES

The Examples are not meant to limit the scope of the claims unless expressly recited as part of the claims.

Example 1

Figure 8:
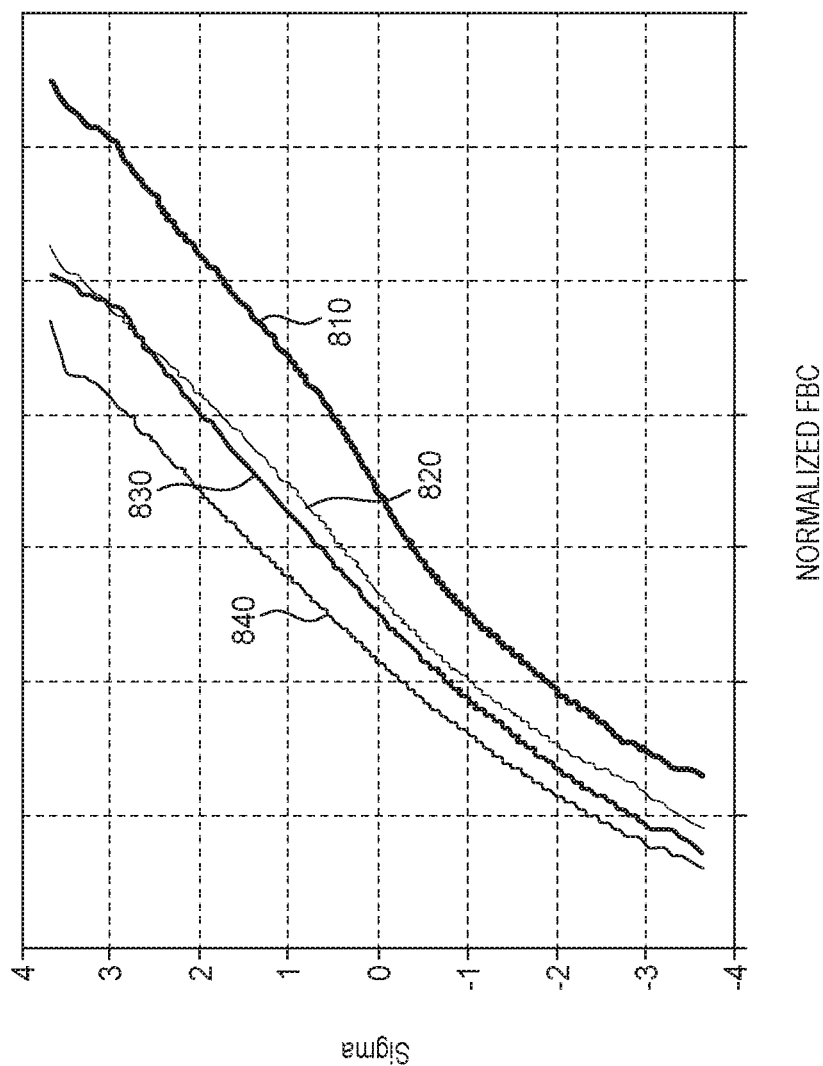
FIG. 8 is a sigma plot of the failed bit count of a read of a NAND flash memory die in cross temperature conditions under various searches.

FIG. 8 is a sigma plot of the failed bit count (FBC) of a read of a NAND flash memory die in cross temperature conditions under various searches. Reads of the NAND flash memory die were conducted under a search 810 over default TC parameters, a search 820 over the SEN2 parameter, a search 830 over the VBLC parameter, and a search 840 over both the SEN2 and VBLC parameter. The search 840 using two TC parameters of SEN2 and VBLC showed a lower FBC than the searches 830, 820, 810.

Example 2

Table II shows an offline characterization of a NAND flash memory die conducted from a cross temperature from 125° C. to −40° C. The columns were different VBLC parameters. The rows were different SENS 2 parameters. The columns and rows form a pair of VBLC-SENS parameters. The percentage of NAND flash memory blocks of the NAND flash memory die in which the particular pair of VBLC-SEN2 parameters resulted in the lowest BER of a read for that particular NAND flash memory block is shown.

TABLE II

| us/V      | 0 (0.1) | 3 (0.25) | 6 (0.4) | 9 (0.55) | 12 (0.7) |
|-----------|---------|----------|---------|----------|----------|
| 18 (0.56) | 0%      | 0%       | 0%      | 0%       | 0%       |
| 40 (1)    | 0%      | 0%       | 2%      | 3%       | 1%       |
| 62 (1.44) | 0%      | 1%       | 7%      | 10%      | 7%       |
| 85 (1.88) | 0%      | 3%       | 10%     | 12%      | 12%      |
| 106 (2.32)| 0%      | 5%       | 12%     | 9%       | 5%       |

While the foregoing is directed to embodiments of the present disclosure, other and further embodiments of the disclosure may be devised without departing from the basic scope thereof, and the scope thereof is determined by the claims that follow.

What is claimed is:

1. A method of temperature compensation to read a flash memory device, comprising:
   determining a current environment state of the flash memory device;
   selecting an action with a maximum Q-value from a Q-table for the current environment state during exploitation, the Q-table comprising a plurality of actions for each of a plurality of environment states of the flash memory device;
   conducting a read operation of a code word from the flash memory device using one or more parameters according to the selected action; and
   decoding the code word with an error correction code (ECC) process.

2. The method of claim 1, further comprising selecting an action with a non-maximum Q-value using a probability of $p=1-\varepsilon$ from the Q-table during exploration.

3. The method of claim 1, further comprising:
   determining an estimated bit error rate (BER) of the code word from the read operation, wherein the decoding the code word with the ECC process occurs if the estimated BER is at or below a decoding limit; and
   selecting another action from the Q-table for the current environment state to conducted another read operation of the code word from the flash memory device using one or more parameters according to the selected another action.

4. The method of claim 1, wherein determining the current environment state of the flash memory device is a previous read access environment state in a sequential or a random read operation of the flash memory device, wherein the selecting the action determines a next environment state of the flash memory device.

5. The method of claim 1, wherein a triggering event selected from a group consisting of a temperature difference between a read temperature and a program temperature of a stored data is higher than a threshold, a decoding failure of an ECC engine, a host request, and a recovery mode by a storage device controller is performed before the selecting the action.

6. The method of claim 1, wherein the environment state of the flash memory device comprises one or more characteristics selected from a group consisting of a current environment state temperature compensation (TC) parameters, a previous environment state TC parameters, a current environment state syndrome weight, a previous environment state syndrome weight, a time after programming, a programming temperature, a read temperature, a number of program/erase cycles, and quantizations thereof.

7. The method of claim 1, wherein the one or more parameters of each of the plurality of actions are selected from a group consisting of a bit line voltage, a sense amplification time, and read threshold voltages.

8. The method of claim 1, wherein the plurality of actions comprises a first set of actions comprising a first set of one or more parameters and comprises a second set of actions comprising a second set of one or more parameters, the first set of one or more parameters determined by offline characterization of the flash memory device and the second set of one or more parameters determined by online characterization of the flash memory device.

9. The method of claim 1, wherein the Q-table comprises a Q-value for each of the plurality of actions which is updated based upon a reward to minimize accumulative decoding latency.

10. A data storage device, comprising:
a memory die;
a control die coupled to the memory die, the control die including Q-learning logic comprising a bit error rate (BER) estimation module and a Q-table; and
a storage device controller coupled to the control die;
the Q-learning logic operable to:
determine a current environment state of the memory die;
select an action with a maximum Q-value from a Q-table for the current environment state during exploitation, wherein the Q-table comprises a plurality of actions for each of a plurality of environment states of the memory die; and
conduct a read operation of a code word from the memory die using one or more parameters according to the selected action.

11. The data storage device of claim 10, wherein the control die further comprises an error correction code (ECC) engine, wherein the Q-learning logic is further operable to transfer the code word to the ECC engine for decoding.

12. The data storage device of claim 10, wherein the storage device controller further comprises an error correction code (ECC) engine, wherein the Q-learning logic is further operable to transfer the code word to the ECC engine for decoding.

13. The data storage device of claim 10, wherein the determined current environment state of the memory die is a previous read access environment state in a sequential or a random read operation of the memory die, wherein the selected action determines a next environment state of the memory die.

14. The data storage device of claim 10, wherein the Q-learning logic is for a current read operation after a triggering event selected from a group consisting of a temperature difference between a read temperature and a program temperature of a stored data is higher than a threshold, a decoding failure of an ECC engine, a host request, or a recovery mode by a storage device controller.

15. The data storage device of claim 10, wherein the environment state of the memory die comprises one or more characteristics selected from a group consisting of a current environment state temperature compensation (TC) parameters, a previous environment state TC parameters, a current environment state syndrome weight, a previous environment state syndrome weight, a time after programming, a programming temperature, a read temperature, a number of program/erase cycles, and quantizations thereof.

16. The data storage device of claim 10, wherein the one or more parameters of each of the plurality of actions are selected from a group consisting of a bit line voltage, a sense amplification time, and read threshold voltages.

17. The data storage device of claim 10, wherein the plurality of actions comprises a first set of actions comprising a first set of one or more parameters and comprises a second set of actions comprising a second set of one or more parameters, the first set of one or more parameters determined by offline characterization of the memory die and the second set of one or more parameters determined by online characterization of the memory die.

18. The data storage device of claim 10, wherein the Q-table comprises a Q-value for each of the plurality of actions which is updated based upon a reward to minimize accumulative decoding latency.

19. A data storage device, comprising:
a memory die; and
a controller coupled to the memory die, the controller comprising:
a bit error rate (BER) estimation module;
a Q-table; and
an error correction code (ECC) engine;
the controller operable to:
determine a current environment state of the memory die;
select an action with a maximum Q-value from a Q-table for the current environment state during exploitation;
conduct a read operation of a code word from the memory die using one or more parameters according to the selected action; and
decode the code word with the (ECC) engine.

20. The data storage device of claim 19, wherein the Q-table comprises a Q-value for each of a plurality of actions and is updated based upon a reward to minimize accumlative decoding latency.

* * * * *